US011362635B2

(12) United States Patent
Kitazume

(10) Patent No.: US 11,362,635 B2
(45) Date of Patent: Jun. 14, 2022

(54) FILTER, MULTIPLEXER AND COMMUNICATION MODULE

(71) Applicant: TAIYO YUDEN CO., LTD., Tokyo (JP)

(72) Inventor: Hidenori Kitazume, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 17/109,876

(22) Filed: Dec. 2, 2020

(65) Prior Publication Data

US 2021/0242850 A1   Aug. 5, 2021

(30) Foreign Application Priority Data

Jan. 31, 2020   (JP) ............... JP2020-015673

(51) Int. Cl.
*H03H 7/01* (2006.01)
*H03H 7/09* (2006.01)
*H03H 7/46* (2006.01)
*H03H 1/00* (2006.01)

(52) U.S. Cl.
CPC ............ *H03H 7/0115* (2013.01); *H03H 7/09* (2013.01); *H03H 7/46* (2013.01); *H03H 2001/0085* (2013.01)

(58) Field of Classification Search
CPC . H03H 2001/0085; H03H 7/0115; H03H 7/09
USPC .......................................... 333/175, 181, 185
See application file for complete search history.

(56) References Cited

U.S. PATENT DOCUMENTS

2015/0295697 A1* 10/2015 Kawachi ............... H03H 9/706
370/276
2020/0389144 A1* 12/2020 Takahashi ............. H05K 1/181

FOREIGN PATENT DOCUMENTS

WO   WO 2019/097774 A1   5/2019

* cited by examiner

*Primary Examiner* — Rakesh B Patel
(74) *Attorney, Agent, or Firm* — Stein IP, LLC

(57) ABSTRACT

A filter includes an input terminal, an output terminal, a plurality sets of first capacitors that include first ends connected to a plurality sets of first nodes, respectively, at different locations in a path capable of transmitting a high frequency signal from the input terminal to the output terminal, and second ends commonly connected to a second node, a plurality sets of first inductors that include third ends connected to the first nodes, respectively, and the fourth ends commonly connected to a third node, a second inductor that includes a fifth end connected to the second node, and a sixth end grounded, and a third inductor that includes a seventh end connected to the third node, and an eighth end grounded.

18 Claims, 17 Drawing Sheets

FILTER, MULTIPLEXER AND COMMUNICATION MODULE

CROSS-REFERENCE TO RELATED APPLICATION

This application is based upon and claims the benefit of priority of the prior Japanese Patent Application No. 2020-015673, filed on Jan. 31, 2020, the entire contents of which are incorporated herein by reference.

FIELD

A certain aspect of the present invention relates to a filter, a multiplexer and a communication module, for example, a filter, a multiplexer and a communication module having a parallel resonance circuit.

BACKGROUND

A wireless communication terminal such as a smart phone and a mobile phone uses a filter that removes unnecessary interfering waves. There is known a filter having a plurality of parallel resonance circuits between a path for transmitting a high frequency signal and a ground terminal, as an example of the filter (for example, Patent Document 1: International Publication Pamphlet No. 2009/097774).

SUMMARY OF THE INVENTION

When the plurality of parallel resonance circuits form a plurality of attenuation poles, a design may be made to change the frequencies of some of the attenuation poles among the plurality of attenuation poles. In such a case, if the frequencies of some of the attenuation poles are changed and hence the frequencies of the other attenuation poles are also changed, the design of the filter gets complicated. This makes it difficult to bring the frequency characteristic of the filter closer to a desired characteristic.

The present disclosure has a purpose of providing a filter, a multiplexer and a communication module having a desired frequency characteristic.

According to an aspect of the present disclosure, there is provided a filter including: an input terminal; an output terminal; a plurality sets of first capacitors that include first ends connected to a plurality sets of first nodes, respectively, at different locations in a path capable of transmitting a high frequency signal from the input terminal to the output terminal, and second ends commonly connected to a second node; a plurality sets of first inductors that include third ends connected to the first nodes, respectively, and the fourth ends commonly connected to a third node; a second inductor that includes a fifth end connected to the second node, and a sixth end grounded; and a third inductor that includes a seventh end connected to the third node, and an eighth end grounded.

DETAILED DESCRIPTION

Hereinafter, embodiments of the present disclosure will be described with reference to the drawings.

First Embodiment

Figure 1:
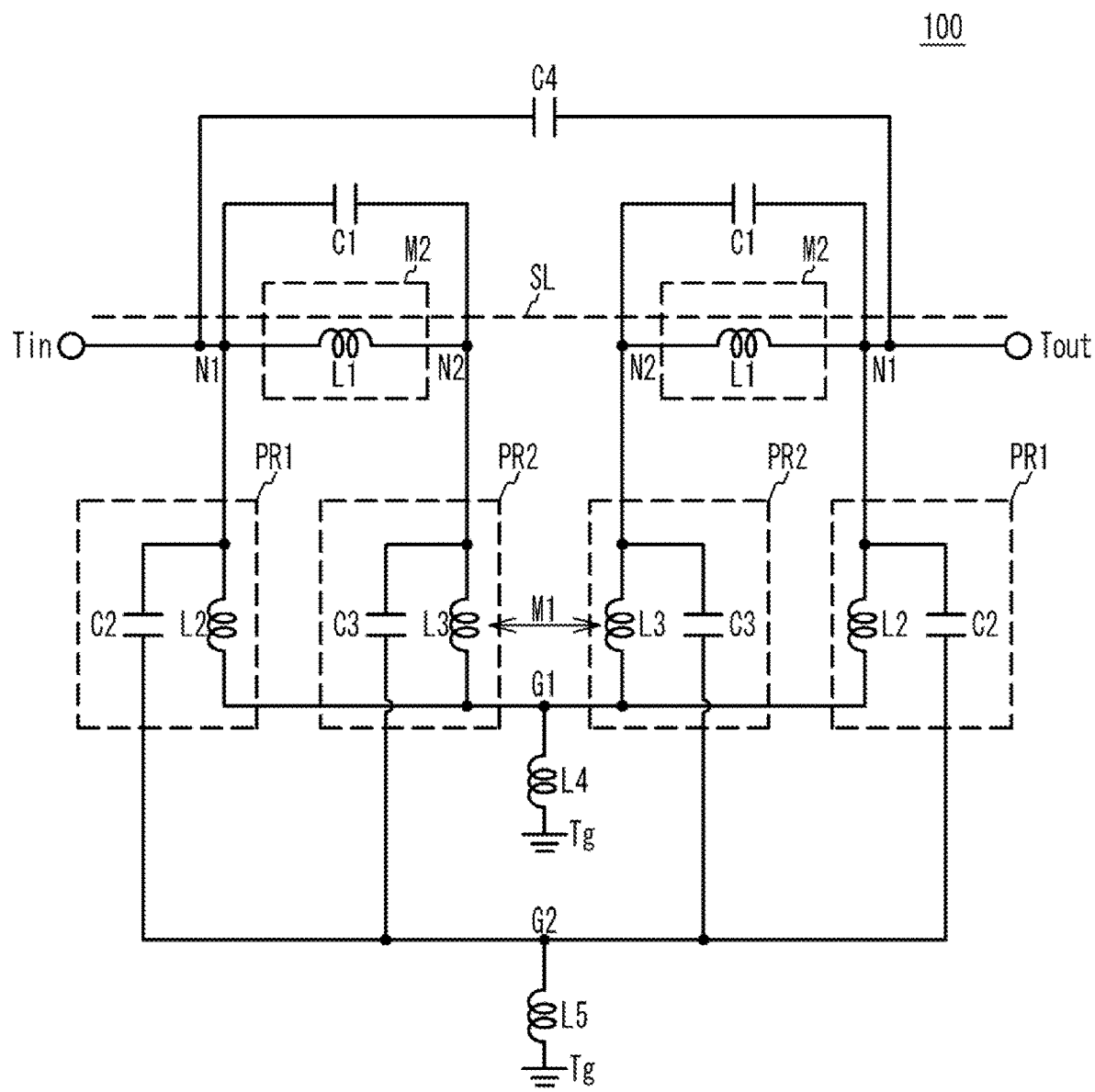
FIG. 1 is a circuit diagram of a filter according to a first embodiment.

In a first embodiment, a bandpass filter (BPF) will be described as an example. FIG. 1 is a circuit diagram of a filter according to the first embodiment. As illustrated in FIG. 1, a filter 100 includes an input terminal Tin, an output terminal Tout, a ground terminal Tg, capacitors C1 to C3, and inductors L1 to L5. Each of inductors L1 is an inductor formed by magnetic coupling M2 between the inductors L2 and L3. Magnetic coupling M1 and M2 is formed by setting distances between the inductors to several tens μm to several hundreds for example.

A path SL is formed between the input terminal Tin and the output terminal Tout via the inductors L1 (the magnetic coupling M2 between the inductors L2 and L3) and the magnetic coupling M1. A high frequency signal can be transmitted from the input terminal Tin to the output terminal Tout via the path SL. A capacitor C4 is connected in parallel with the path SL and between the input terminal Tin and the output terminal Tout. The path SL is provided with nodes N1 on both sides and nodes N2 on a center side.

Capacitors C1 are connected in parallel with the inductors L1 and between the nodes N1 and N2. Parallel resonance circuits PR1 are connected between the nodes N1 and the ground terminal Tg. Each of the parallel resonance circuits PR1 includes a capacitor C2 having one end connected to the node N1 and the inductor L2 having one end connected to the node N1. Parallel resonance circuits PR2 are connected between the nodes N2 and the ground terminal Tg. Each of the parallel resonance circuits PR2 includes the capacitor C2 having one end connected to the node N2 and the inductor L3 having one end connected to the node N2.

An inductor L4 is connected between the ground terminal Tg and a node G1 to which the other end of the inductor L2 and the other end of the inductor L3 are connected. The inductor L5 is connected between the ground terminal Tg and a node G2 to which the other end of the capacitor C2 and the other end of the capacitor C3 are connected.

Figure 2A:
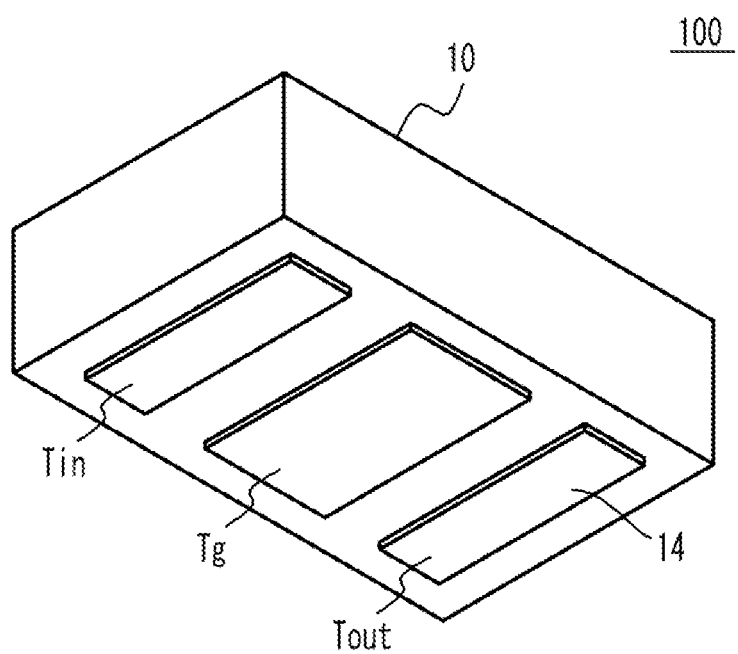
FIG. 2A is a perspective view of the filter according to the first embodiment.
Figure 2B:
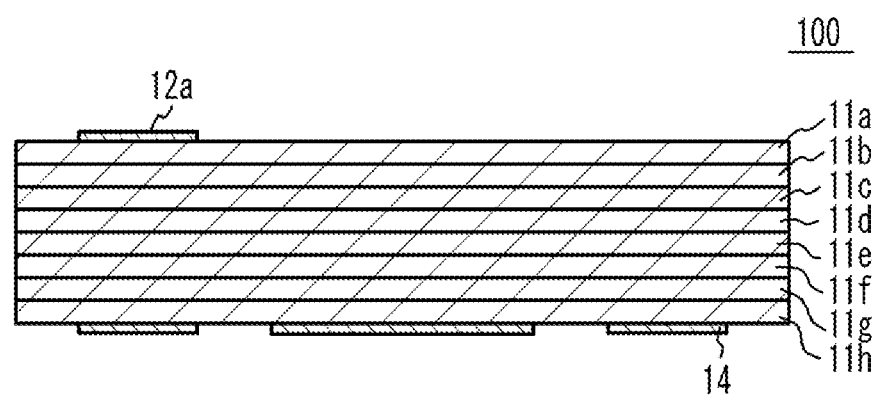
FIG. 2B is a cross-sectional view of the filter according to the first embodiment.

FIG. 2A is a perspective view of the filter 100 according to the first embodiment, and FIG. 2B is a cross-sectional view of the filter 100 according to the first embodiment. As illustrated in FIGS. 2A and 2B, the filter 100 has a laminated body 10. The laminated body 10 includes a plurality of laminated dielectric layers 11a to 11h. Terminals 14 are provided on a lower surface (i.e., a surface of the laminated body 10 in a laminating direction) of the laminated body 10. The terminals 14 are the input terminal Tin, the output terminal Tout, and the ground terminal Tg, for example. A direction identification mark is provided on an upper surface of the laminated body 10 by a conductor pattern 12a.

Figure 3A:
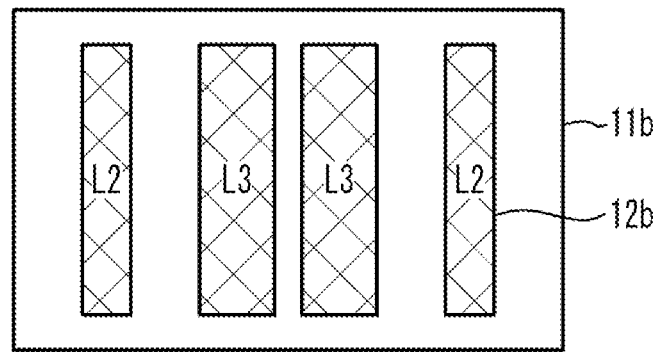
FIGS. 3A to 3D are plan views of dielectric layers according to the first embodiment.
Figure 3B:
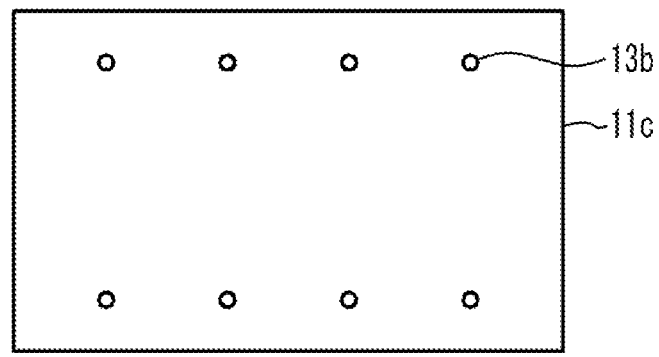
Figure 3C:
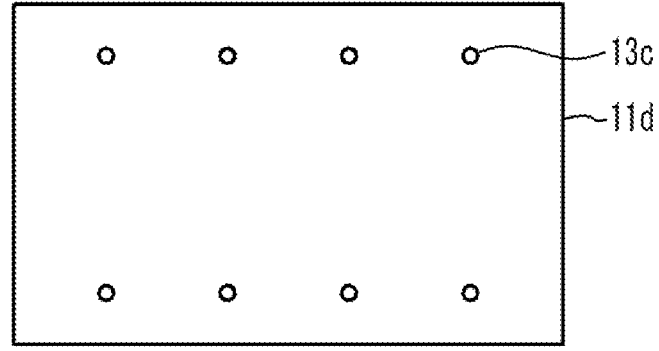
Figure 3D:
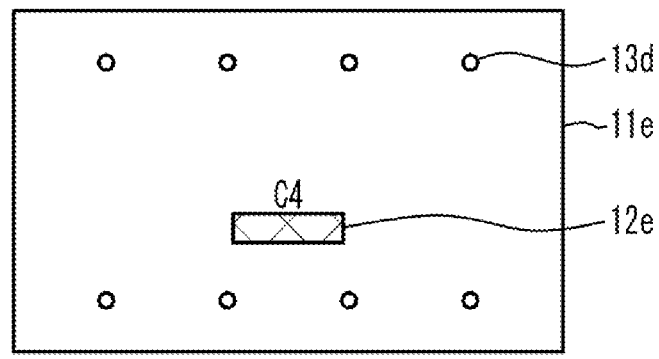
Figure 4A:
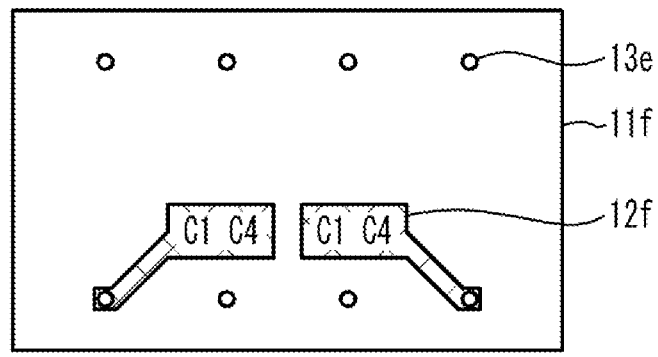
FIGS. 4A to 4D are plan views of dielectric layers according to the first embodiment.
Figure 4B:
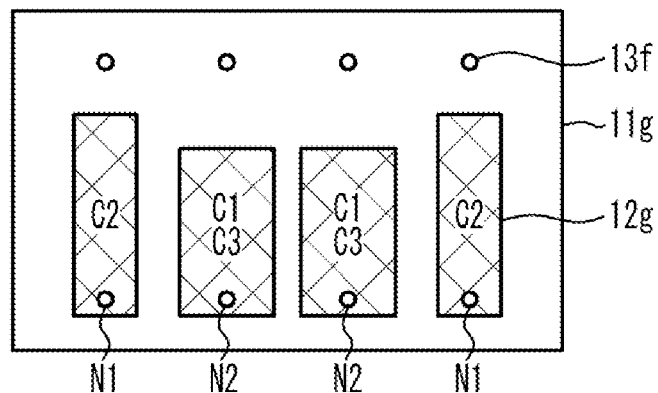
Figure 4C:
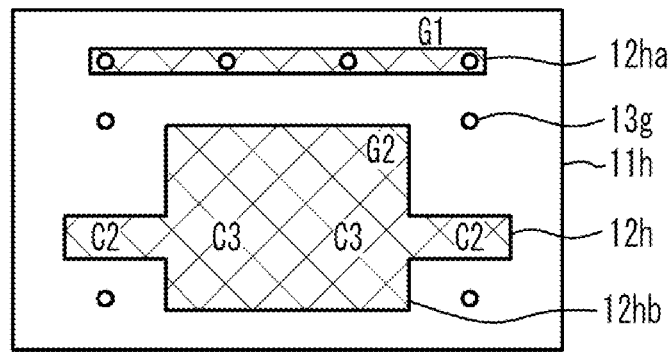
Figure 4D:
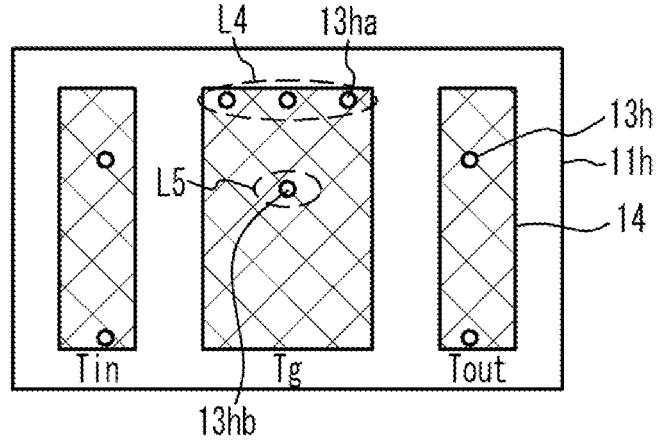

FIGS. 3A to 4D are plan views of the dielectric layers according to the first embodiment. FIGS. 3A to 4C illustrate conductor patterns on the upper surface of each dielectric layer and via wirings penetrating one upper dielectric layer. The via wirings penetrating one upper dielectric layer mean that, for example, the via wirings 13b of FIG. 3B penetrates the dielectric layer 11b of FIG. 3A which is one upper layer of the dielectric layer 11c of FIG. 3B, and the via wirings 13c of FIG. 3C penetrates the dielectric layer 11c of FIG. 3B which is one upper layer of the dielectric layer 11d of FIG. 3C. FIG. 4D illustrates the terminals 14 provided on the lower surface of the dielectric layer 11h and via wirings 13h penetrating the dielectric layer 11h. FIG. 4D illustrates a state in which the dielectric layer 11h of FIG. 4C is transmitted along a downward direction of FIG. 2B.

As illustrated in FIG. 3A, conductor patterns 12b forming a part of the inductors L2 and L3 are provided on the upper surface of a dielectric layer 11b. One ends of the inductors L2 are connected to the nodes N1 through via wirings 13b to 13f. The other ends of the inductors L2 are connected to the node G1 through via wirings 13b to 13g. One ends of the inductors L3 are connected to the nodes N2 through the via wirings 13b to 13f. The other ends of the inductors L3 are connected to the node G1 through the via wirings 13b to 13g.

As illustrated in FIGS. 3B and 3C, the via wirings 13b penetrating the dielectric layer 11b are provided, and the via wirings 13c penetrating the dielectric layer 11c are provided. The via wirings 13b are connected to the inductors L2 and L3. As illustrated in FIG. 3D, a conductor pattern 12e forming one electrode of the capacitor C4 is provided on the upper surface of a dielectric layer 11e. Via wirings 13d penetrating a dielectric layer 11d are provided.

As illustrated in FIG. 4A, conductor patterns 12f forming one electrodes of the capacitors C1 and the other electrode of the capacitor C4 are provided on the upper surface of a dielectric layer 11f. The conductor patterns 12f are connected to the nodes N1 through the via wirings 13f (see FIG. 4B). Via wirings 13e penetrating the dielectric layer 11e are provided.

As illustrated in FIG. 4B, one conductor patterns 12g and the other conductor patterns 12g are provided on the upper surface of a dielectric layer 11g. The one conductor patterns 12g form one electrodes of the capacitors C2 and correspond to the nodes N1, and the other conductor patterns 12g form one electrodes of the capacitors C3 and the other electrodes of the capacitors C1 and correspond to the nodes N2. The one conductor patterns 12g forming one electrodes of the capacitors C2 are connected to the input terminal Tin or the output terminal Tout through the via wirings 13g and 13h (see FIGS. 4C and 4D). Via wirings 13f penetrating the dielectric layer 11f are provided.

As illustrated in FIG. 4C, a conductor pattern 12ha and a conductor pattern 12hb are provided on the upper surface of the dielectric layer 11h. The conductor pattern 12ha forms the node G1 as conductor patterns 12h, and the conductor pattern 12hb forms the other electrodes of the capacitors C2 and the other electrodes of the capacitors C3 and corresponds to the node G2. The conductor patterns 12ha and 12hb are separately formed on the upper surface of the dielectric layer 11h. The via wirings 13g penetrating the dielectric layer 11g are provided.

As illustrated in FIG. 4D, the input terminal Tin, the ground terminal Tg, and the output terminal Tout are provided on the lower surface of the dielectric layer 11h. The conductor pattern 12ha forming the node G1 is connected to the ground terminal Tg through via wirings 13ha penetrating the dielectric layer 11h. The conductor pattern 12hb forming the node G2 is connected to the ground terminal Tg through a via wiring 13hb penetrating the dielectric layer 11h. The via wirings 13ha form the inductor L4, and the via wiring 13hb forms the inductor L5. Via wirings 13h penetrating the dielectric layer 11h are provided.

The dielectric layers 11a to 11h are made of a ceramic material, and include an oxide of, for example, Si, Ca and Mg (e.g. $CaMgSi_2O_6$ which is a diopside crystal) as a main component. The main component of the dielectric layers 11a to 11h may be an oxide other than oxides including Si, Ca and/or Mg. Further, the dielectric layers 11a to 11h may include an oxide including at least one of Ti, Zr and Al as an insulating material.

The conductor patterns 12a to 12h, the via wirings 13b to 13f, and an upper part of the terminals 14 are metal layers including, for example, Ag, Pd, Pt, Cu, Ni, Au, Au—Pd alloy, or Ag—Pt alloy, as main components. The upper part of the terminals 14 may include a non-conductive material such as $TiO_2$, $ZrO_2$ or $Al_2O_3$ in addition to the above metal material. A lower part of the terminals 14 is a Ni film and a Sn film.

First Comparative Example

Figure 5:
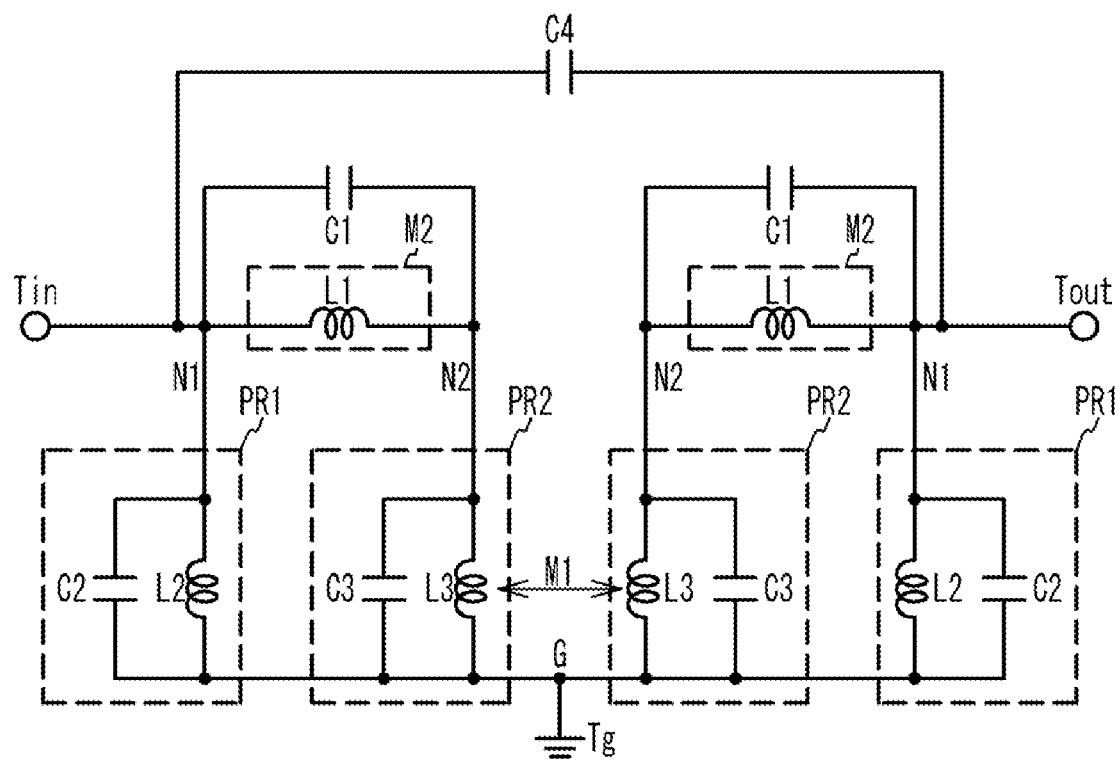
FIG. 5 is a circuit diagram of a filter according to a first comparative example.

FIG. 5 is a circuit diagram of a filter according to a first comparative example. As illustrated in FIG. 5, the other ends of the inductors L2 and the other ends of the capacitors C2 are connected to the node G. The node G is connected to the ground terminal Tg without an inductor. Other configurations of the filter are the same as those of the filter in the first embodiment, and the description thereof will be omitted.

Figure 6:
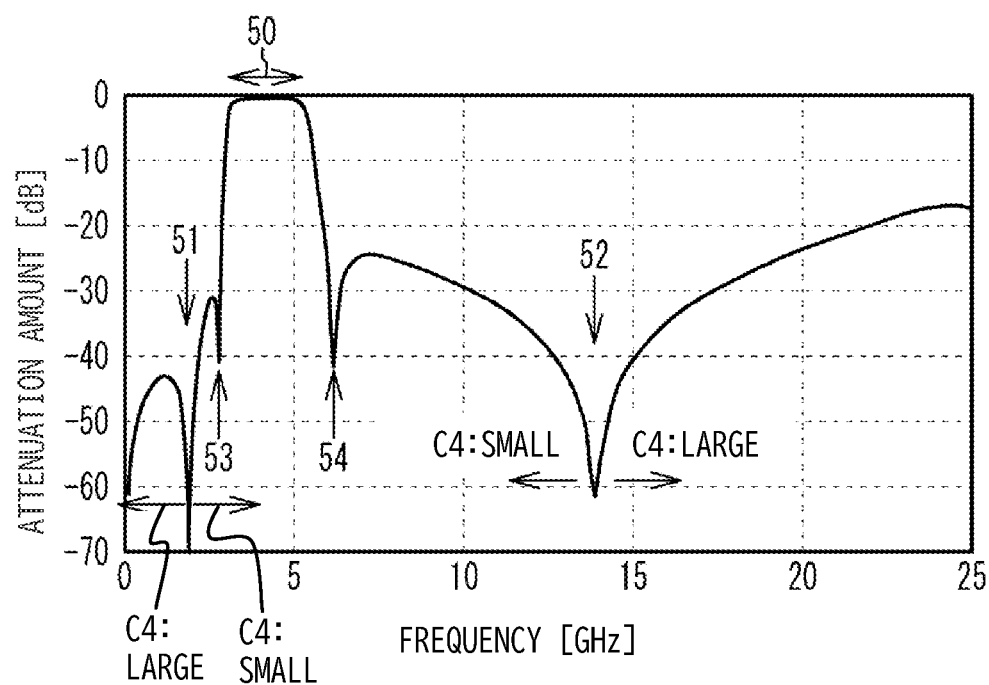
FIG. 6 is a schematic diagram illustrating a passing characteristic of a filter according to the first comparative example.

FIG. 6 is a schematic diagram illustrating a passing characteristic of the filter according to the first comparative example. As illustrated in FIG. 6, a pass band 50 has a frequency between about 3 GHz and about 5 GHz. An attenuation pole 53 is formed near a low frequency end of the pass band 50, and an attenuation pole 54 is formed near a high frequency end of the pass band 50. An attenuation pole 51 is formed away from the pass band 50 to a low frequency side, and an attenuation pole 52 is formed away from the pass band 50 to a high frequency side. The attenuation poles 51 and 52 are mainly formed by the parallel resonance circuits PR1 and PR2. The attenuation pole 53 is mainly formed by the capacitors C1 and the inductors L1, and the attenuation pole 54 is mainly formed by the magnetic coupling M1.

It is required that the attenuation poles 51 and 52 are provided in a desired frequency band. The frequencies of the attenuation poles 51 and 52 can be changed by changing the capacitance of the capacitor C4. For example, when the capacitance of the capacitor C4 is reduced, the frequency of the attenuation pole 51 is higher and the frequency of the attenuation pole 52 is lower. For example, when the capacitance of the capacitor C4 is increased, the frequency of the attenuation pole 51 is lower and the frequency of the attenuation pole 52 is higher. Thus, when trying to increase the frequency of the attenuation pole 52, the frequency of the attenuation pole 51 is lower, and it is therefore difficult to make the frequencies of the attenuation poles 51 and 52 as desired.

As in Patent Document 1, it is conceivable to shunt-connect a capacitor to the path of the capacitor C4. However, adding the capacitor makes the size of the filter larger.

Second Comparative Example

Figure 7:
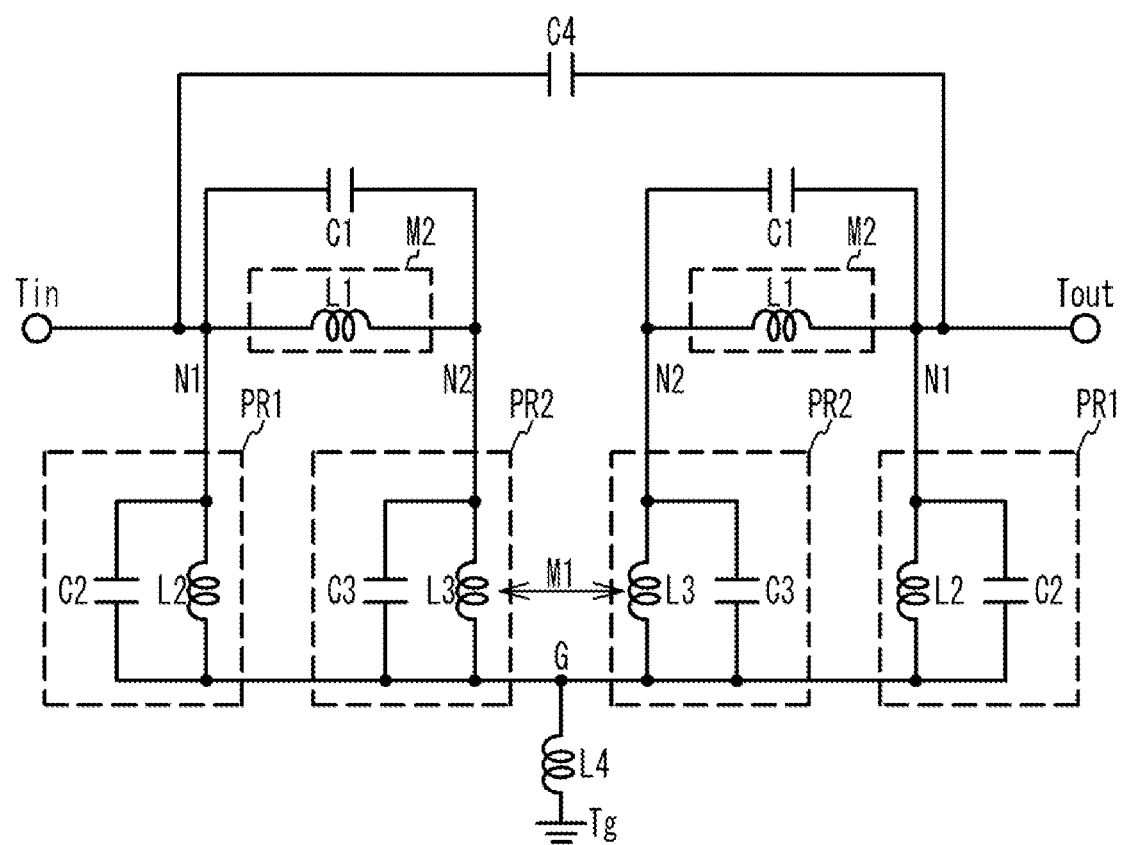
FIG. 7 is a circuit diagram of a filter according to a second comparative example.

FIG. 7 is a circuit diagram of a filter according to a second comparative example. As illustrated in FIG. 7, the other ends of the inductors L2 and the other ends of the capacitors C2 are connected to the node G. The inductor L4 is connected between the node G and the ground terminal Tg. Other configurations of the filter are the same as those of the filter in the first embodiment, and the description thereof will be omitted.

Figure 8A:
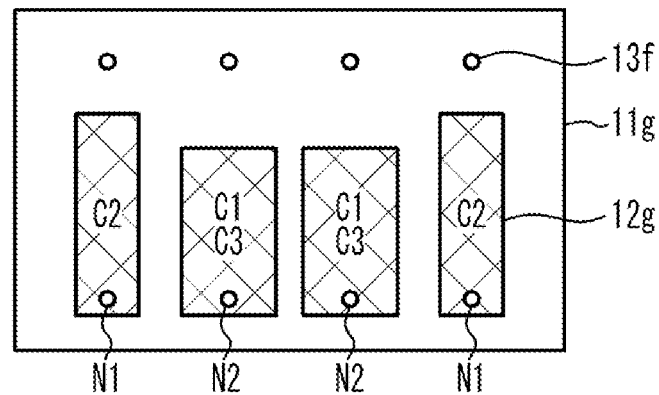
FIGS. 8A to 8C are plan views of dielectric layers according to the second comparative example.
Figure 8B:
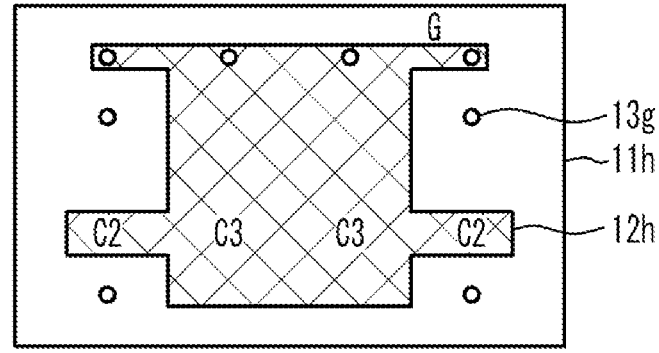
Figure 8C:
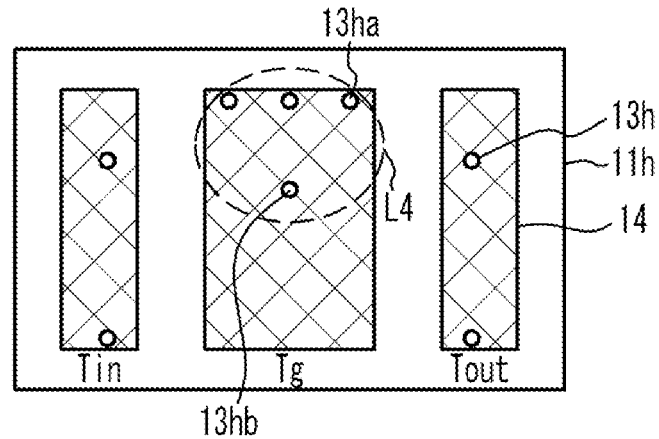

FIGS. 8A to 8C are plan views of dielectric layers according to the second comparative example. As illustrated in FIG. 8A, the conductor patterns 12g provided on the upper surface of the dielectric layer 11g are the same as those in FIG. 4B of the first embodiment.

As illustrated in FIG. 8B, the conductor pattern 12h forming the node G is provided on the upper surface of the dielectric layer 11h. Unlike FIG. 4C of the first embodiment, the conductor pattern 12h is not separated into a plurality of conductor patterns but is integrally formed.

As illustrated in FIG. 8C, the conductor pattern 12h forming the node G (see FIG. 8B) is connected to the ground terminal Tg through the via wirings 13ha and 13hb penetrating the dielectric layer 11h. The via wirings 13ha and 13hb form the inductor L4. Other configurations of the filter are the same as those of the filter in the first embodiment, and the description thereof will be omitted.

(Simulation)

With respect to the first embodiment and the second comparative example, a three-dimensional electromagnetic field simulation was performed using a finite element method to calculate the passing characteristics.

In the simulation, each of the thicknesses of the dielectric layers 11b to 11d was set to 100 µm, each of the thicknesses of the dielectric layers 11e to 11g was set to 8 µm, and the thickness of the dielectric layer 11h was set to 25 µm. A plane size of each of the dielectric layers 11b to 11h was set to 2000 µm×1250 µm. Each of the dielectric layers 11a to 11h includes $CaMgSi_2O_6$ as a main component.

Since the filter 100 handles high frequencies of 1 GHz to 20 GHz, the filter 100 functions like a distributed constant circuit. Therefore, the capacitances of the capacitors C1 to C4 and the inductances of the inductors L1 to L5 are not determined, but approximate values of the capacitances and the inductances in the first embodiment are illustrated in Table 1. Here, the approximate values of the inductances of the inductors L4 and L5 correspond to a sample D of the first embodiment.

TABLE 1

| CAPACITANCE [pF] | | | | INDUCTANCE [nH] | | | | |
|---|---|---|---|---|---|---|---|---|
| C1 | C2 | C3 | C4 | L1 | L2 | L3 | L4 | L5 |
| 1.1 | 0.6 | 1.2 | 0.1 | 10 | 1 | 1 | 0.0001 | 0.001 |

Simulation was performed on the following samples A to F.

Sample A: second comparative example
  Number of Via Wirings 13ha: 3
  Number of Via Wirings 13hb: 0
Sample B: second comparative example
  Number of Via Wirings 13ha: 1
  Number of Via Wirings 13hb: 0
The sample A has the inductor L4 with a smaller inductance than the sample B.
Sample C: first embodiment
  Number of Via Wirings 13ha: 3
  Number of Via Wirings 13hb: 3
Sample D: first embodiment
  Number of Via Wirings 13ha: 3
  Number of Via Wirings 13hb: 1
The inductances of the inductors L4 of the samples C and D are almost the same. The sample C has the inductor L5 with a smaller inductance than the sample D.
Sample E: first embodiment
  Number of Via Wirings 13ha: 3
  Number of Via Wirings 13hb: 3
Sample F: first embodiment
  Number of Via Wirings 13ha: 1
  Number of Via Wirings 13hb: 3
The inductances of the inductors L5 of the samples E and F are almost the same. The sample E has the inductor L4 with a smaller inductance than the sample F.

Figure 9:
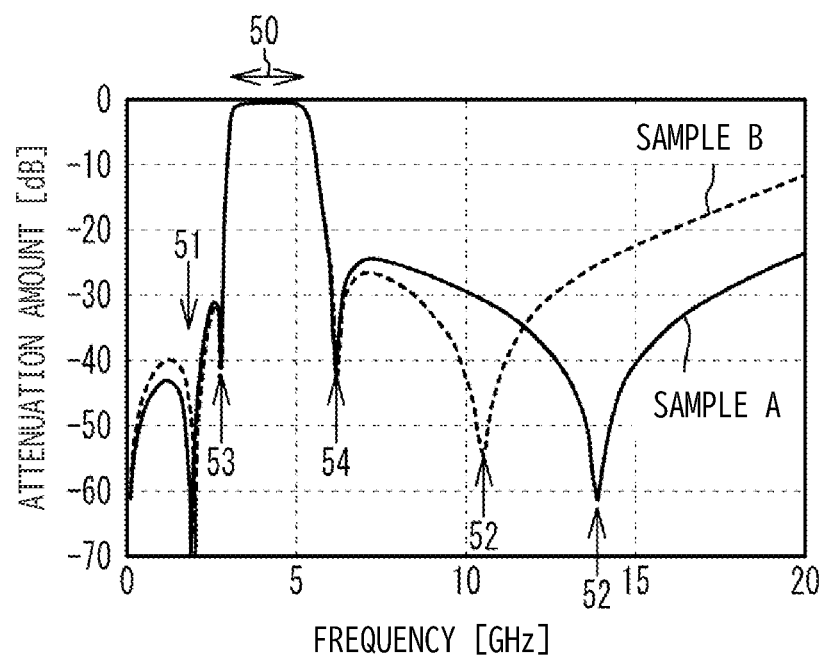
FIG. 9 is a diagram illustrating passing characteristics of samples A and B according to the second comparative example.

FIG. 9 is a diagram illustrating the passing characteristics of the samples A and B according to the second comparative example. As illustrated in FIG. 9, the pass bands 50 and the attenuation poles 53 and 54 of the samples A and B are almost unchanged. The frequency of the attenuation pole 52 of the sample B is lower than that of the sample A. Thus, in the second comparative example, the frequency of the attenuation pole 52 can be set by changing the inductance of the inductor L4. Thereby, the attenuation pole 52 can be set at a desired frequency. However, the frequency of the attenuation pole 51 of the sample B is higher than that of the sample A. In this way, changing the inductance of the inductor L4 changes the frequency of the attenuation pole 51. Thus, in the second comparative example, it is difficult to make both frequencies of the attenuation poles 51 and 52 as desired. Further, in the sample B, an amount of attenuation in a frequency band lower than the attenuation pole 51 becomes smaller.

Figure 10:
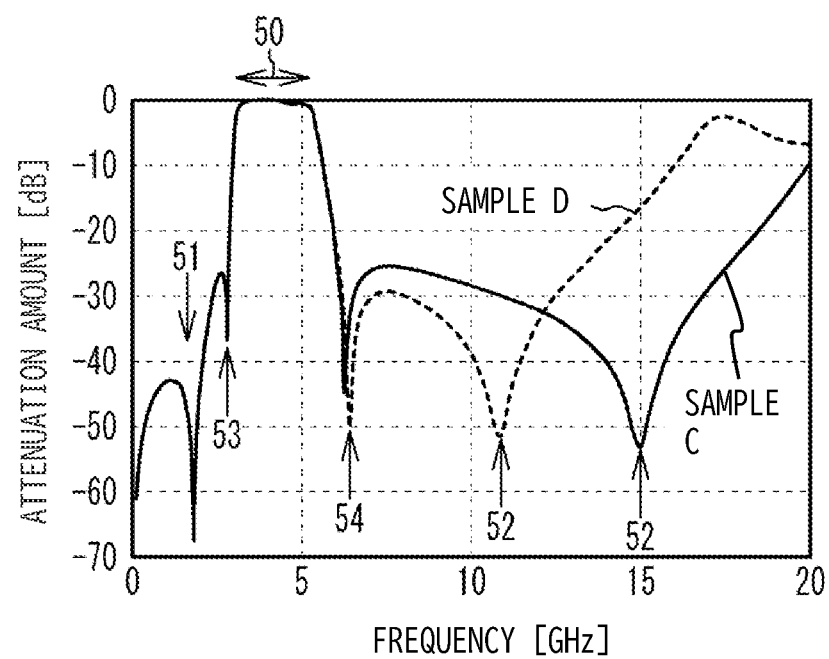
FIG. 10 is a diagram illustrating passing characteristics of samples C and D according to the first embodiment.

FIG. 10 is a diagram illustrating the passing characteristics of the samples C and D according to the first embodiment. As illustrated in FIG. 10, the pass bands 50 and the attenuation poles 53 and 54 of the samples C and D are almost unchanged. The frequency of the attenuation pole 52 of the sample D is lower than that of the sample D. Thus, in the first embodiment, by changing the inductance of the inductor L5, the frequency of the attenuation pole 52 can be set with almost no change in the attenuation characteristics at frequencies lower than the pass band 50. Thereby, the attenuation pole 52 can be set at a desired frequency.

Figure 11:
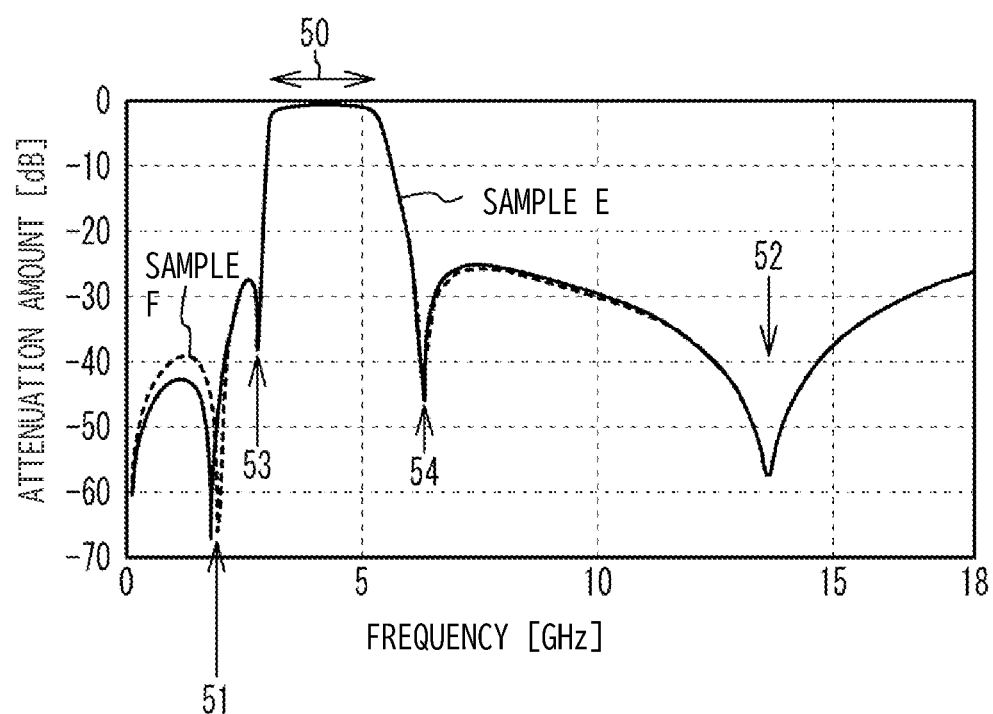
FIG. 11 is a diagram illustrating passing characteristics of samples E and F according to the first embodiment.

FIG. 11 is a diagram illustrating the passing characteristics of the samples E and F according to the first embodiment. As illustrated in FIG. 11, the pass bands 50 and the attenuation poles 52, 53 and 54 of the samples E and F are almost unchanged. The frequency of the attenuation pole 51 of the sample F is higher than that of the sample E. Thus, in the first embodiment, by changing the inductance of the inductor L4, the frequency of the attenuation pole 51 can be set with almost no change in the attenuation characteristics at frequencies higher than the pass band 50. Thereby, the attenuation pole 51 can be set at a desired frequency. The amount of attenuation in the frequency band lower than the attenuation pole 51 of the sample E is smaller than that of the sample F. Thus, it is preferable that the inductance of the inductor L4 is small. That is, the inductance of the inductor L4 is preferably equal to or less than that of the inductor L5. Therefore, the number of via wirings 13ha is preferably equal to or greater than the number of via wirings 13hb.

First Variation of First Embodiment

Figure 12A:
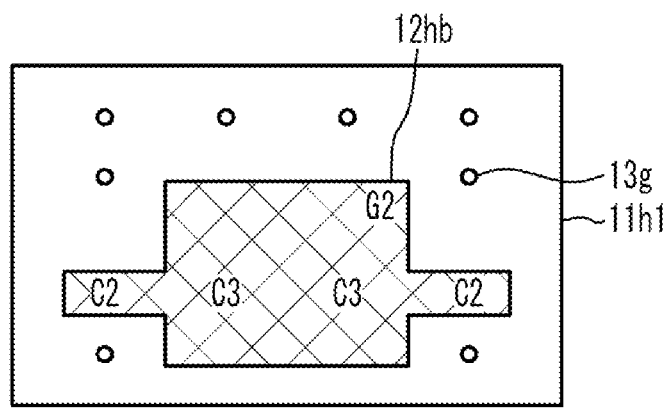
FIGS. 12A to 12C are plan views of dielectric layers according to a first variation of the first embodiment.
Figure 12B:
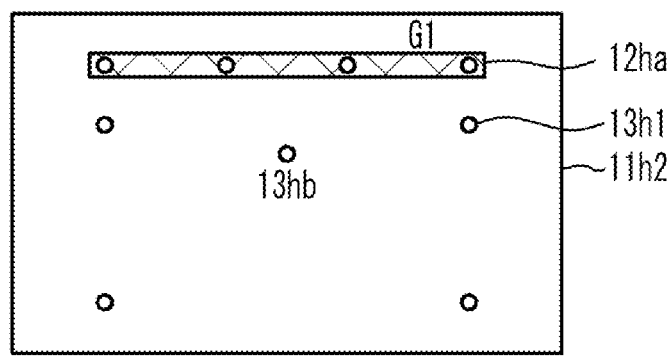
Figure 12C:
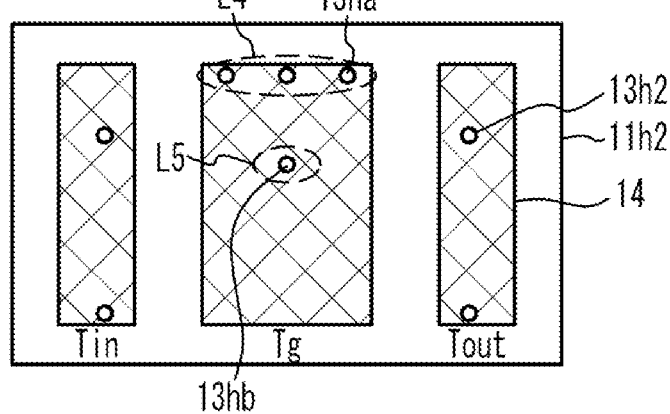

FIGS. 12A to 12C are plan views of the dielectric layers according to a first variation of the first embodiment. A dielectric layer 11h1 of FIG. 12A is provided between the dielectric layer 11g of FIG. 4B in the first embodiment and a dielectric layer 11h2 of FIG. 12C.

As illustrated in FIG. 12A, the conductor pattern 12hb forming the node G2 is provided on the upper surface of the dielectric layer 11h1. As illustrated in FIG. 12B, the conductor pattern 12ha forming the node G1 is provided on the upper surface of the dielectric layer 11h2. Via wirings 13h1 penetrating the dielectric layer 11h1 are provided. As illustrated in FIG. 12C, the terminals 14 are provided on the lower surface of the dielectric layer 11h2. Via wirings 13h2 penetrating the dielectric layer 11h2 are provided.

The conductor pattern 12hb is electrically connected to the ground terminal Tg through the via wirings 13hb including the via wirings 13h1 and 13h2. The via wirings 13hb form the inductor L5. The conductor pattern 12ha is electrically connected to the ground terminal Tg through the via wirings 13ha including the via wirings 13h2. The via wirings 13ha forms the inductor L4. Other configurations of the filter are the same as those of the filter in the first embodiment, and the description thereof will be omitted.

In the first variation of the first embodiment, the conductor pattern 12hb forming the node G2 is further away from the ground terminal Tg than the conductor pattern 12ha forming the node G1. This allows the inductance of the inductor L5 to be increased. Therefore, the attenuation characteristic in the frequency band lower than the pass band 50 can be improved.

Second Variation of First Embodiment

Figure 13:
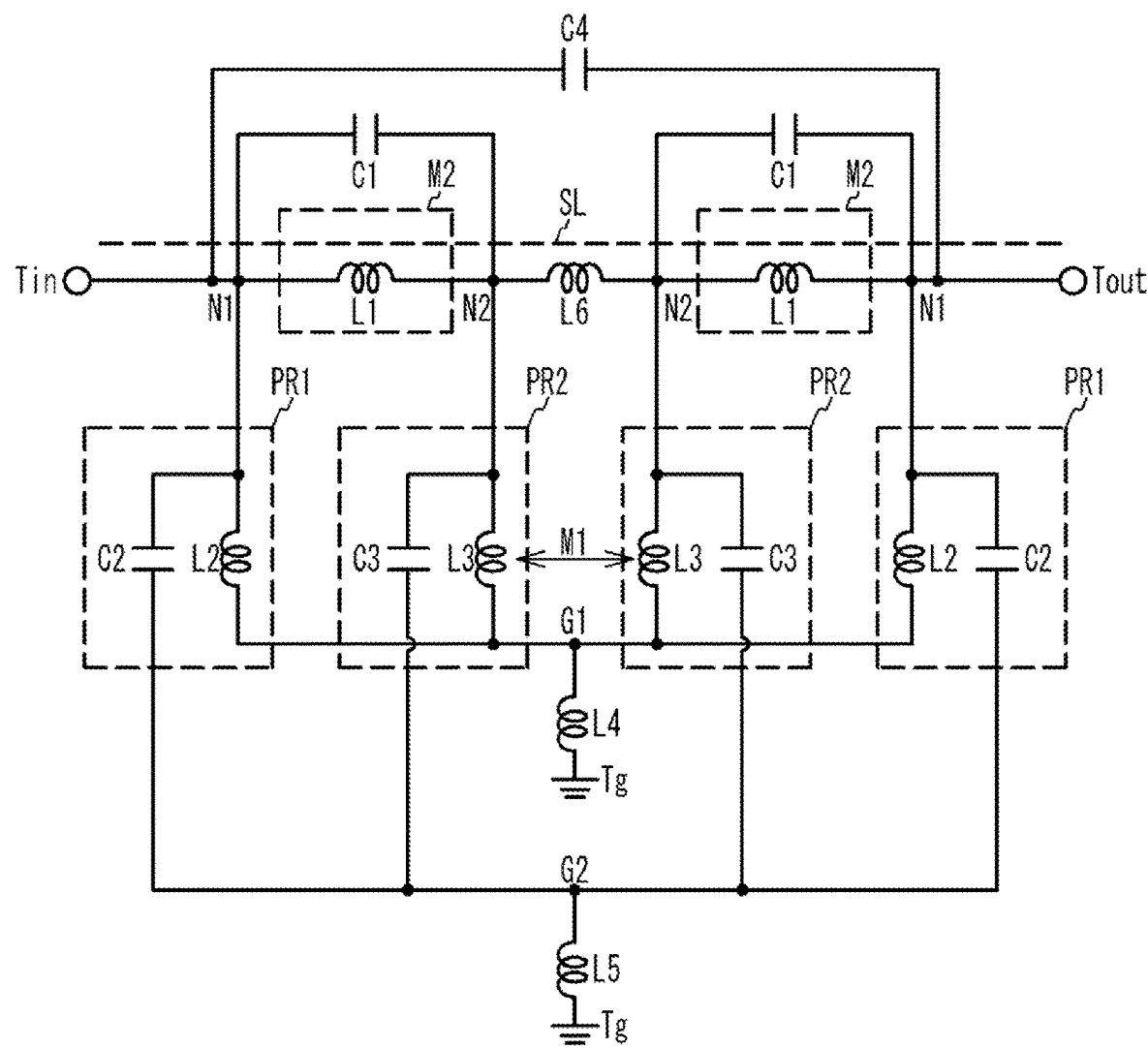
FIG. 13 is a circuit diagram of a filter according to a second variation of the first embodiment.

FIG. 13 is a circuit diagram of a filter according to a second variation of the first embodiment. As illustrated in FIG. 13, the inductors L1 are connected between the nodes N1 and N2 in parallel with the capacitors C1. An inductor L6 is connected between the nodes N2, but is not the inductor coupling.

Figure 14A:
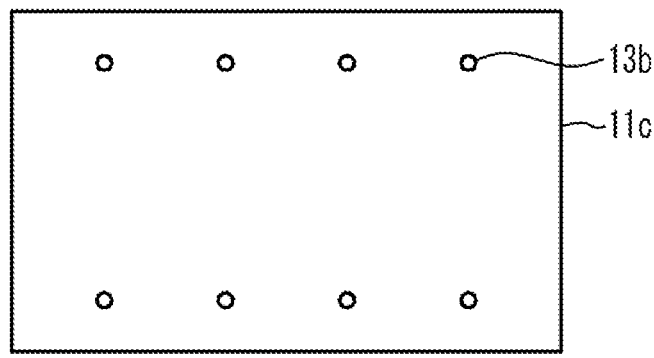
FIGS. 14A to 14D are plan views of dielectric layers according to the second variation of the first embodiment.
Figure 14B:
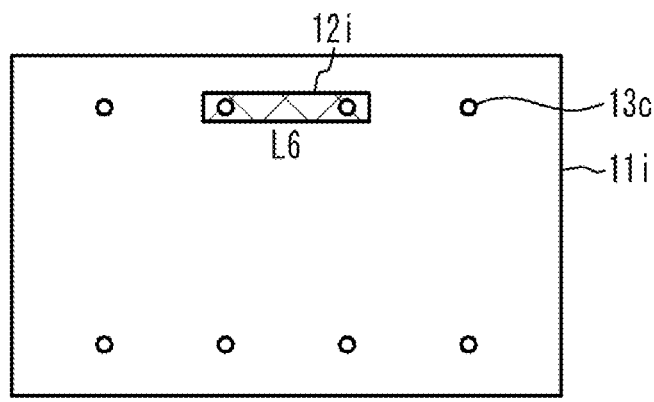
Figure 14C:
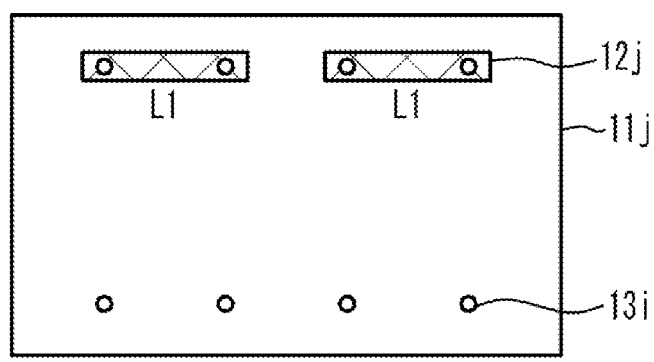
Figure 14D:
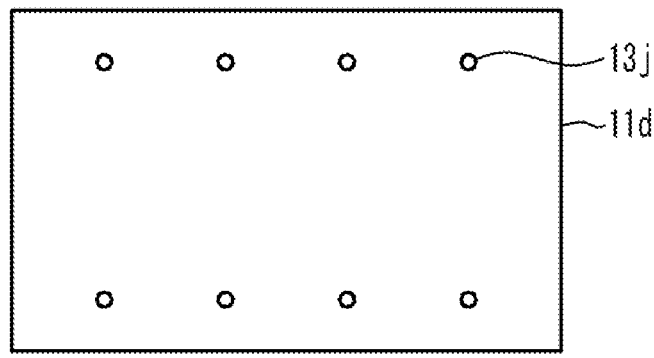

FIGS. 14A to 14D are plan views of dielectric layers according to the second variation of the first embodiment. A dielectric layer 11i of FIG. 14B and a dielectric layer 11j of FIG. 14C are provided between the dielectric layer 11c of FIG. 14A and the dielectric layer 11d of FIG. 14D. The configurations of the dielectric layer 11c of FIG. 14A and the dielectric layer 11d of FIG. 14D are the same as those of the dielectric layer 11c of FIG. 3B and the dielectric layer 11d of FIG. 3C in the first embodiment, respectively. In FIG. 14D, the via wirings 13j penetrating the dielectric layer 11j are provided.

As illustrated in FIG. 14B, a conductor pattern 12i forming the inductor L6 is provided on the upper surface of the dielectric layer 11i. Both ends of the inductor L6 are connected to one ends of the inductors L3 through the via wirings 13b and 13c, respectively.

As illustrated in FIG. 14C, conductor patterns 12j forming the inductors L1 are provided on the upper surface of the dielectric layer 11j. One ends of the inductors L1 are connected to one ends of the inductors L2 through the via wirings 13b, 13c and 13i, respectively, and are connected to the node G1 through the via wirings 13j, 13d to 13g. The other ends of the inductors L1 are connected to both ends of the inductor L6 through the via wirings 13i, respectively, and are connected to the node G1 through the via wirings 13j and 13d to 13g. The via wirings 13i penetrating the dielectric layer 11i are provided. Other configurations of the filter are the same as those of the filter in the first embodiment, and the description thereof will be omitted.

As in the second variation of the first embodiment, the path SL may be formed mainly by the inductors L1 and L6 rather than by the magnetic coupling.

Third Variation of First Embodiment

Figure 15:
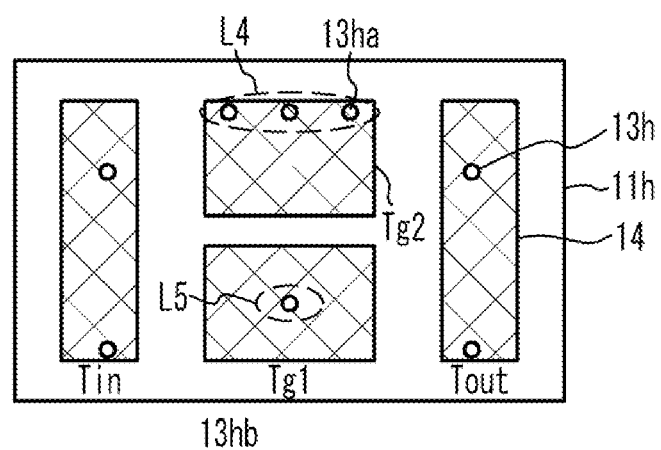
FIG. 15 is a plan view of a dielectric layer according to a third variation of the first embodiment.

FIG. 15 is a plan view of a dielectric layer according to a third variation of the first embodiment. As illustrated in FIG. 15, a plurality of ground terminals Tg1 and Tg2 are provided on the lower surface of the dielectric layer 11h. The inductor L4 is connected to the ground terminal Tg2, and the inductor L5 is connected to the ground terminal Tg1. Other configurations of the filter are the same as those of the filter in the first embodiment, and the description thereof will be omitted.

As in the third variation of the first embodiment, the plurality of ground terminals Tg1 and Tg2 may be provided. The inductor L4 may be connected to at least one of one or more ground terminals, and the inductor L5 also may be connected to at least one of one or more ground terminals.

According to the first embodiment and variations thereof, one ends of the capacitors C2 and C3 (i.e., a plurality sets of first capacitors) are connected to the nodes N1 and N2 (i.e., a plurality of first nodes at different locations in the path SL), respectively, and the other ends thereof are commonly connected to the node G2 (i.e., a second node). One ends of the inductors L2 and L3 (i.e., a plurality sets of first inductors) are connected to the nodes N1 and N2, respectively, and the other ends thereof are commonly connected to the node G1 (i.e., a third node). One end of the inductor L5 (i.e., a second inductor) is connected to the node G2, and the other end thereof is grounded (i.e., the other end is connected to the ground terminal Tg). One end of the inductor L4 (i.e., a third inductor) is connected to the node G1, and the other end thereof is grounded (i.e., the other end is connected to the ground terminal Tg). Thereby, the inductances of the inductors L4 and L5 can be set independently, so that the frequencies of the attenuation poles 51 and 53 can be set independently. Therefore, the filter can be designed to have a desired frequency characteristic.

As in the first embodiment, at least a part of the path SL is formed of the magnetic coupling M1 and M2 between at least two inductors among the plurality sets of the inductors L2 and L3. Thereby, the path SL can be provided (by the magnetic coupling) without using an inductor.

As in the second variation of the first embodiment, at least a part of the path SL may include the inductors L1 and L6 (i.e., a fourth inductor) connected between at least two nodes among plural sets of the nodes N1 and N2.

As in the comparison of the samples E and F in the simulation, from the viewpoint of improving the attenuation characteristic in the frequency band lower than the pass band 50, the inductance of the inductor L5 is preferably larger than the inductance of the inductor L4, more preferably 1.5 times or more than the inductance of the inductor L4, and further preferably twice or more than the inductance of the inductor L4.

As in the first embodiment, the conductor pattern 12hb (i.e., a first metal pattern) forming at least a part of the node G2, and the conductor pattern 12ha (i.e., a second metal pattern) forming at least a part of the node G1 are provided on a surface (i.e., a first surface) between adjacent dielectric layers 11g and 11h, and are configured as individual patterns separated from each other. The via wirings 13hb (i.e., a first via wiring) connect the conductor pattern 12hb and the ground terminal Tg and penetrate at least one dielectric layer 11h among the plurality of dielectric layers 11a to 11h. The via wirings 13ha (i.e., a second via wiring) connect the conductor pattern 12ha and the ground terminal Tg and penetrate the dielectric layer 11h. Thereby, the inductors L5 and L4 can be formed by one or more via wirings 13hb and one or more via wirings 13ha.

The sum of the cross-sectional areas of one or more via wirings 13hb is made smaller than the sum of the cross-sectional areas of one or more via wirings 13ha, so that the inductance of the inductor L5 can be larger than the inductance of the inductor L4.

As in the first variation of the first embodiment, the conductive pattern 12hb is provided on a surface (i.e., a first surface) between the dielectric layers 11g and 11h1, and the conductive pattern 12ha is provided on a surface (i.e., a second surface closer to the lower surface of the laminated body 10 than the first surface) between the dielectric layers 11h1 and 11h2. Thereby, the inductance of the inductor L5 can be larger than the inductance of the inductor L4.

The capacitors C1 and C4 (i.e., a second capacitor) are connected in parallel with at least a part of the path SL. Thereby, the attenuation pole 53 can be formed. At least one of the capacitors C1 and C4 need not be provided.

The filter may be a low-pass filter or a high-pass filter. The filter is a bandpass filter, and a pass characteristic of the bandpass filter includes the attenuation pole 53 (i.e., a first attenuation pole) formed mainly by the inductors L2 and L3, the capacitors C2 and C3, and the inductor L4 at a frequency lower than the pass band 50, and the attenuation pole 52 (i.e., a second attenuation pole) formed mainly by the inductors L2 and L3, the capacitors C2 and C3, and the inductor L5 at a frequency higher than the pass band 50. Thereby, the frequencies of the attenuation poles 51 and 52 can be designed independently.

In the first embodiment and the first variation thereof, four parallel resonance circuits PR1 and PR2 are described, but a plurality of parallel resonance circuits PR1 and PR2 may be provided.

Second Embodiment

Figure 16:
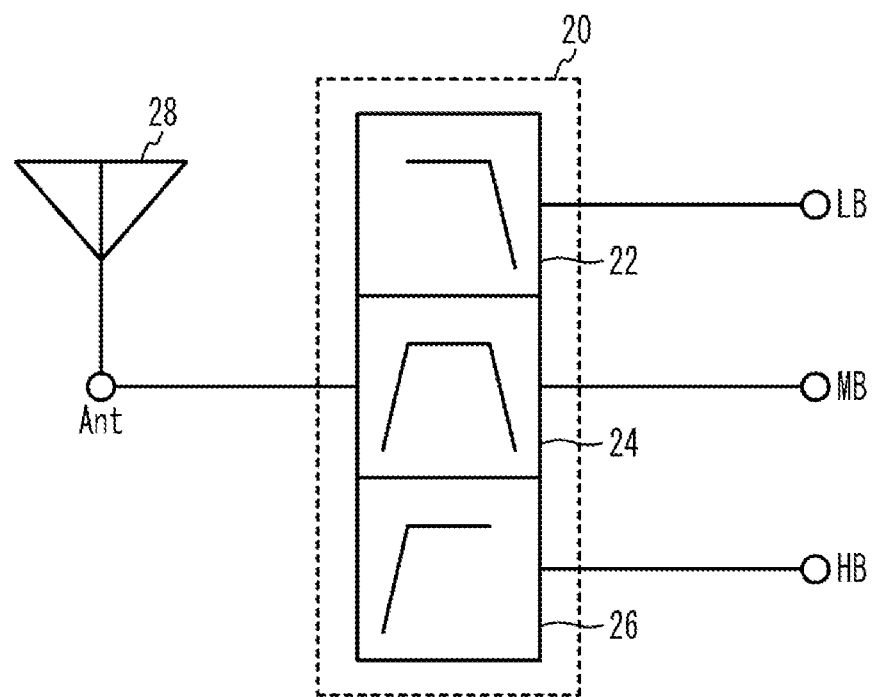
FIG. 16 is a circuit diagram of a triplexer according to a second embodiment.

FIG. 16 is a circuit diagram of a triplexer according to a second embodiment. As illustrated in FIG. 16, a triplexer 20 includes filters 22, 24 and 26. The filters 22, 24 and 26 are connected between a common terminal Ant and terminals LB, MB and HB, respectively. An antenna 28 is connected to the common terminal Ant. The filter 22 is, for example, a low-pass filter LPF, which passes high frequency signals in a low band and suppresses signals having another frequencies. The filter 24 is, for example, a bandpass filter BPF, which passes high frequency signals in a middle band having frequencies higher than those in the low band and suppresses signals having another frequencies. The filter 26 is, for example, a high-pass filter HPF, which passes high frequency signals in a high band having frequencies higher than those in the middle band and suppresses signals having another frequencies.

At least one of the filters 22, 24 and 26 can be a filter according to the first embodiment and the variations thereof. Although the triplexer is described as an example of the multiplexer, the multiplexer may be a diplexer, a duplexer, or a quadplexer.

First Variation of Second Embodiment

Figure 17:
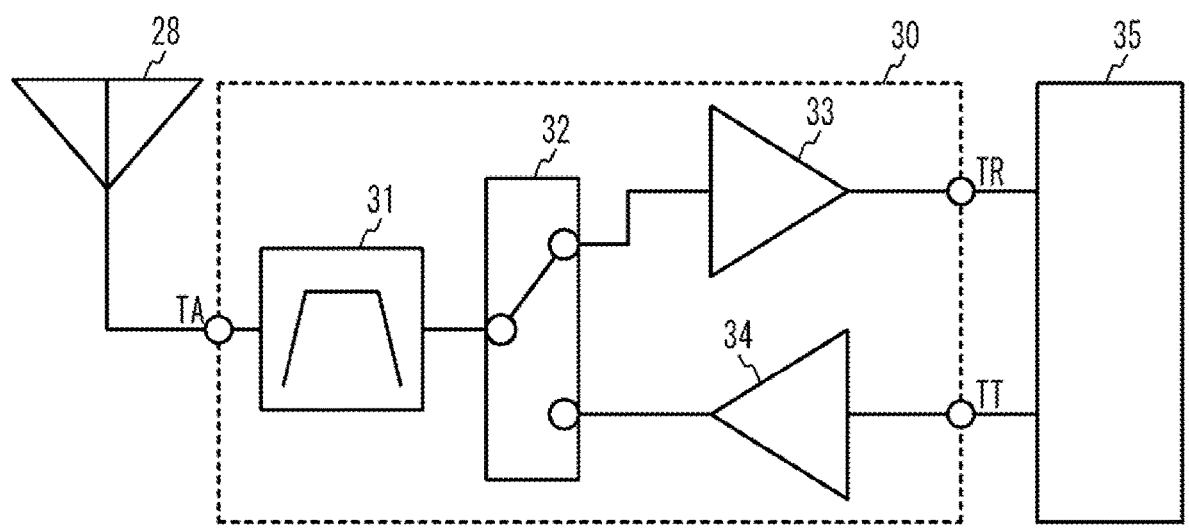
FIG. 17 is a circuit diagram of a communication module according to a first variation of the second embodiment.

FIG. 17 is a circuit diagram of a communication module according to a first variation of the second embodiment. As illustrated in FIG. 17, a module 30 includes a filter 31, a switch 32, a low noise amplifier LNA 33, and a power amplifier PA 34.

The antenna 28 is connected to an antenna terminal TA. One end of the filter 31 is connected to the antenna terminal TA. The switch 32 is connected to the other end of the filter 31. An input terminal of the LNA 33 and an output terminal of the PA 34 are connected to the switch 32. An output terminal of the LNA 33 is connected to a reception terminal TR. An input terminal of the PA 34 is connected to a transmission terminal TT. An RFIC (Radio Frequency Integrated Circuit) 35 is connected to the reception terminal TR and the transmission terminal TT.

The module 30 is, for example, a communication module of a TDD (Time Division Duplex) communication system. In the TDD communication method, a transmission band and a reception band are the same bands. The filter 31 is, for example, a bandpass filter, which passes high frequency signals in a pass band including the transmission band and the reception band and suppresses signals having another frequencies.

When the reception signal is received, the switch 32 connects the filter 31 and the LNA 33. Thereby, a high frequency signal received by the antenna 28 is filtered by the filter 31 into a signal in the reception band, amplified by the LNA 33, and output to the RFIC 35. When the transmission signal is transmitted, the switch 32 connects the filter 31 and the PA 34. Thereby, a high frequency signal output from the RFIC 35 is amplified by the PA 34, filtered by the filter 31 into a signal in the transmission band, and output from the antenna 28.

The filter 31 in the communication module of the second variation of the first embodiment can be used as the filter of the first embodiment and the variations thereof. The module may be a communication module for another circuit system.

Although the embodiments of the present invention have been described in detail, it is to be understood that the various change, substitutions, and alterations could be made hereto without departing from the spirit and scope of the invention.

What is claimed is:

1. A filter comprising:
an input terminal;
an output terminal;
a plurality of sets of first capacitors that include first ends connected to a plurality of sets of first nodes, respectively, at different locations in a path capable of transmitting a high frequency signal from the input terminal to the output terminal, and second ends commonly connected to a second node;
a plurality of sets of first inductors that include third ends connected to the first nodes, respectively, and the fourth ends commonly connected to a third node;
a second inductor that includes a fifth end connected to the second node, and a sixth end grounded; and
a third inductor that includes a seventh end connected to the third node, and an eighth end grounded,
wherein
the second node is connected to all of the second ends without passing through the third node,
the third node is connected to all of the fourth ends without passing through the second node,
the fifth end is connected to the second node without passing through the third inductor, and
the seventh end is connected to the third node without passing through the second inductor.

2. The filter according to claim 1, wherein
at least a part of the path is formed of magnetic coupling between at least two first inductors among the plurality of sets of first inductors.

3. The filter according to claim 1, wherein
at least a part of the path includes a fourth inductor connected between at least two first nodes among the plurality of sets of the first nodes.

4. The filter according to claim 1, wherein
an inductance of the second inductor is larger than that of the third inductor.

5. The filter according to claim 1, further comprising:
a laminated body that includes a plurality of laminated dielectric layers, and one or more around terminals provided on an outer surface in a laminating direction;
a first metal pattern that is provided on a first surface between adjacent dielectric layers among the plurality of dielectric layers, and forms at least a part of the second node;
a second metal pattern that is provided on the first surface, is separated from the first metal pattern on the first surface, and forms at least a part of the third node;
one or more first via wirings that connect the first metal pattern and at least one of the one or more ground terminals, and penetrate at least one of the plurality of dielectric layers; and
one or more second via wirings that connect the second metal pattern and at least one of the one or more ground terminals, and penetrate at least one of the plurality of dielectric layers.

6. The filter according to claim 5, wherein
a sum of cross-sectional areas of the one or more first via wirings is smaller than that of the cross-sectional areas of the one or more second via wirings.

7. The filter according to claim 1, further comprising:
a laminated body that includes a plurality of laminated dielectric layers, and one or more ground terminals provided on an outer surface in a laminating direction;
a first metal pattern that is provided on a first surface between adjacent dielectric layers among the plurality of dielectric layers, and forms at least a part of the second node;
a second metal pattern that is provided on a second surface between adjacent dielectric layers among the plurality of dielectric layers, and forms at least a part of the third node, the second surface being closer to the outer surface than the first surface;
one or more first via wirings that connect the first metal pattern and at least one of the one or more ground terminals, and penetrate at least two of the plurality of dielectric layers; and
one or more second via wirings that connect the second metal pattern and at least one of the one or more ground terminals, and penetrate at least one of the plurality of dielectric layers.

8. The filter according to claim 1, further comprising:
a second capacitor connected in parallel with at least a part of the path.

9. The filter according to claim 1, wherein
the filter is a bandpass filter.

10. The filter according to claim 9, wherein
a pass characteristic of the bandpass filter includes:
a first attenuation pole formed by at least the plurality of sets of first inductors, the plurality of sets of first capacitors and the second inductor at a frequency lower than a pass band; and
a second attenuation pole formed by at least the plurality of sets of first inductors, the plurality of sets of first capacitors and the third inductor at a frequency higher than the pass band.

11. A multiplexer comprising:
the filter according to claim 1.

12. A communication module comprising:
the filter according to claim 1.

13. A filter comprising:
an input terminal;
an output terminal;
a plurality of sets of first capacitors that include first ends connected to a plurality of sets of first nodes, respectively, at different locations in a path capable of transmitting a high frequency signal from the input terminal to the output terminal, and second ends commonly connected to a second node;
a plurality of sets of first inductors that include third ends connected to the first nodes, respectively, and the fourth ends commonly connected to a third node;
a second inductor that includes a fifth end connected to the second node, and a sixth end grounded;
a third inductor that includes a seventh end connected to the third node, and an eighth end grounded;
a laminated body that includes a plurality of laminated dielectric layers, and one or more ground terminals provided on an outer surface in a laminating direction;
a first metal pattern that is provided on a first surface between adjacent dielectric layers among the plurality of dielectric layers, and forms at least a part of the second node;
a second metal pattern that is provided on the first surface, is separated from the first metal pattern on the first surface, and forms at least a part of the third node;
one or more first via wirings that connect the first metal pattern and at least one of the one or more ground terminals; and penetrate at least one of the plurality of dielectric layers; and
one or more second via wirings that connect the second metal pattern and at least one of the one or more ground terminals, and penetrate at least one of the plurality of dielectric layers.

14. A communication module comprising:
the filter according to claim 13.

15. A multiplexer comprising:
the filter according to claim 13.

16. A filter comprising:
an input terminal;

an output terminal;

a plurality of sets of first capacitors that include first ends connected to a plurality of sets of first nodes, respectively, at different locations in a path capable of transmitting a high frequency signal from the input terminal to the output terminal, and second ends commonly connected to a second node;

a plurality of sets of first inductors that include third ends connected to the first nodes, respectively, and the fourth ends commonly connected to a third node;

a second inductor that includes a fifth end connected to the second node, and a sixth end grounded;

a third inductor that includes a seventh end connected to the third node, and an eighth end grounded;

a laminated body that includes a plurality of laminated dielectric layers, and one or more around terminals provided on an outer surface in a laminating direction;

a first metal pattern that is provided on a first surface between adjacent dielectric layers among the plurality of dielectric layers, and forms at least a part of the second node;

a second metal pattern that is provided on a second surface between adjacent dielectric layers among the plurality of dielectric layers, and forms at least a part of the third node, the second surface being closer to the outer surface than the first surface;

one or more first via wirings that connect the first metal pattern and at least one of the one or more ground terminals, and penetrate at least two of the plurality of dielectric layers; and one or more second via wirings that connect the second metal pattern and at least one of the one or more ground terminals, and penetrate at least one of the plurality of dielectric layers.

17. A multiplexer comprising:

the filter according to claim 16.

18. A communication module comprising:

the filter according to claim 16.

* * * * *